United States Patent
Fan et al.

(10) Patent No.: US 6,747,310 B2
(45) Date of Patent: Jun. 8, 2004

(54) FLASH MEMORY CELLS WITH SEPARATED SELF-ALIGNED SELECT AND ERASE GATES, AND PROCESS OF FABRICATION

(75) Inventors: Der-Tsyr Fan, Hsinchu (TW); Chiou-Feng Chen, Hsinchu (TW); Prateep Tuntasood, Santa Clara, CA (US)

(73) Assignee: Actrans System Inc., Santa Clara, CA (US)

( * ) Notice: Subject to any disclaimer, the term of this patent is extended or adjusted under 35 U.S.C. 154(b) by 0 days.

(21) Appl. No.: 10/267,014

(22) Filed: Oct. 7, 2002

(65) Prior Publication Data

US 2004/0065917 A1 Apr. 8, 2004

(51) Int. Cl.[7] ............................................. H01L 29/788
(52) U.S. Cl. ......................... 257/320; 257/316; 257/319
(58) Field of Search ................................. 257/320, 316, 257/319

(56) References Cited

U.S. PATENT DOCUMENTS 5,874,759 A * 2/1999 Park .......................... 257/314
6,091,104 A    7/2000 Chen .......................... 257/326
6,291,297 B1   9/2001 Chen .......................... 438/265
6,476,440 B1 * 11/2002 Shin .......................... 257/320

* cited by examiner

Primary Examiner—David Nelms
Assistant Examiner—Tu-Tu Ho
(74) Attorney, Agent, or Firm—Edward S. Wright

(57) ABSTRACT

Flash memory and process of fabrication in which vertically stacked pairs of floating gates and control gates are formed on opposite sides of a source diffusion in a substrate, an erase gate is formed directly above the source diffusion and between the stacked gates, select gates are formed on the sides of the stacked gates opposite the erase gate, programming paths extend from mid-channel regions in the substrate between the select gates and the stacked gates to the edge portions of the floating gates which face the select gates, and erase paths extend from the edge portions of the floating gates which face the erase gates to the source diffusion and to the erase gate. In some embodiments, the source regions are connected electrically to the erase gates, and in others the floating gates project laterally beyond the control gates on one or both sides of the control gates. These memory cells are very small in size and provide substantially better programming and erase performance than memory cells of the prior art.

31 Claims, 13 Drawing Sheets

US 6,747,310 B2

FLASH MEMORY CELLS WITH SEPARATED SELF-ALIGNED SELECT AND ERASE GATES, AND PROCESS OF FABRICATION

BACKGROUND OF THE INVENTION

1. Field of Invention

This invention pertains generally to semiconductor memory devices and, more particularly, to nonvolatile memory and the manufacture thereof.

2. Related Art

Nonvolatile memory is currently available in several forms, including electrically programmable read only memory (EPROM), electrically erasable programmable read only memory (EEPROM), and flash EEPROM.

U.S. Pat. Nos. 6,091,104 and 6,291,297 show a split-gate memory cell of relatively small size, efficient erase performance, and relatively programming current requirements. The small size is obtained through self-alignment of the select, control and floating gates, and the efficiency in erasing is provided by the use of Fowler-Nordheim tunneling from a sharply rounded side edge of the floating gate to the select gate. The programming current is kept small by the use of mid-channel hot carrier injection from the off-gate channel region between the select gate and the floating gate to the sharply curved side edge of the floating gate.

A memory cell of this type is illustrated in FIG. 1 as having a floating gate 16, a control gate 17, and select gate 18, all of which are fabricated of polysilicon. The control gate is stacked above the floating gate, and the select gate is positioned to the side of the stacked gates. With the three polysilicon gates which are formed in a triple polysilicon fabrication process, this type of cell is sometimes referred to as a 3P self-aligned split gate cell.

In the programming mode, the control gate is biased at a voltage of about 10 volts, the select gate is biased at about −2 volts, and the source 19 is biased at about −6 volts. The strong electric field thus established across the mid-channel gate oxide 21 between select gate 18 and floating gate 16 causes electrons to be accelerated and injected into the floating gate, as indicated by arrow 22.

In the erase mode, a negative voltage of about −10 volts is applied to the control gate, and a positive voltage of about 6 volts is applied to the select gate. In this mode, the electric field across the inter-poly oxide 23 between the select gate and the rounded side wall 24 of the floating gate initiates Fowler-Nordheim tunneling, with electrons flowing from the floating gate to the select gate, as indicated by arrow 50

While the 3P self-aligned split gate cell structure and the unique programming and erase techniques employed with it permit a smaller cell size than the widely used ETOX structure, as cell sizes decrease into the range of hundreds of nanometers, it is limited by the need to remove polysilicon from the source region and in the narrow, steep valleys between adjacent control and floating gate stacks.

OBJECTS AND SUMMARY OF THE INVENTION

It is in general an object of the invention to provide a new and improved flash memory cell and fabrication process.

Another object of the invention is to provide a memory cell and process of the above character which overcome the limitations and disadvantages of the prior art.

Another object of the invention is to provide a memory cell and process of the above character in which the memory cell is very small in size and provides significantly enhanced programming and erase performance.

These and other objects are achieved in accordance with the invention by providing a flash memory and process of fabrication in which vertically stacked pairs of floating gates and control gates are formed on opposite sides of a source diffusion in a substrate, an erase gate is formed directly above the source diffusion and between the stacked gates, select gates are formed on the sides of the stacked gates opposite the erase gate, programming paths extend from mid-channel regions in the substrate between the select gates and the stacked gates to the edge portions of the floating gates which face the select gates, and erase paths extend from the edge portions of the floating gates which face the erase gates to the source diffusion and to the erase gate. In some embodiments, the source regions are connected electrically to the erase gates, and in others the floating gates project laterally beyond the control gates on one or both sides of the control gates. These memory cells are very small in size and provide substantially better programming and erase performance than memory cells of the prior art.

DETAILED DESCRIPTION

Figure 1:
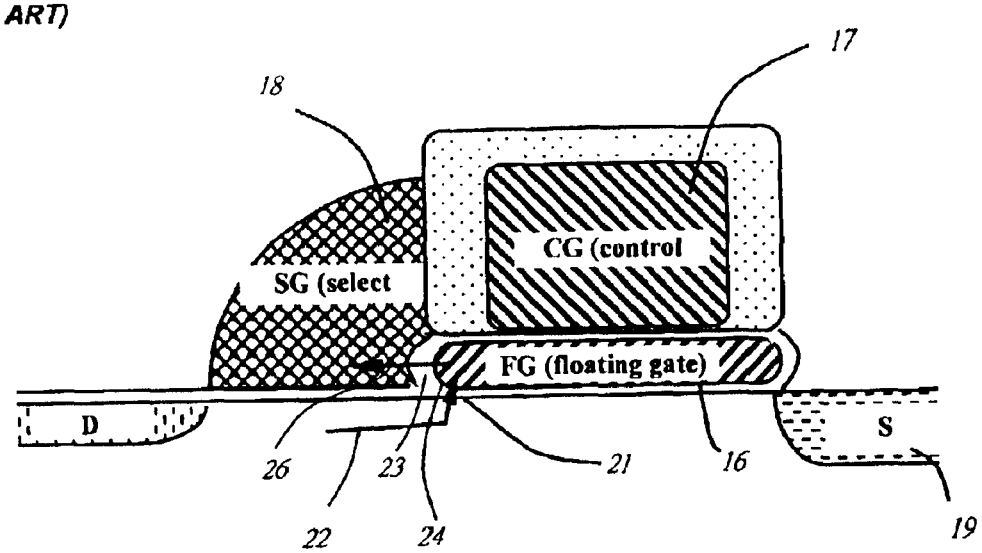
FIG. 1 is a cross-sectional view of a split-gate NOR flash memory cell structure of the prior art.
Figure 2A:
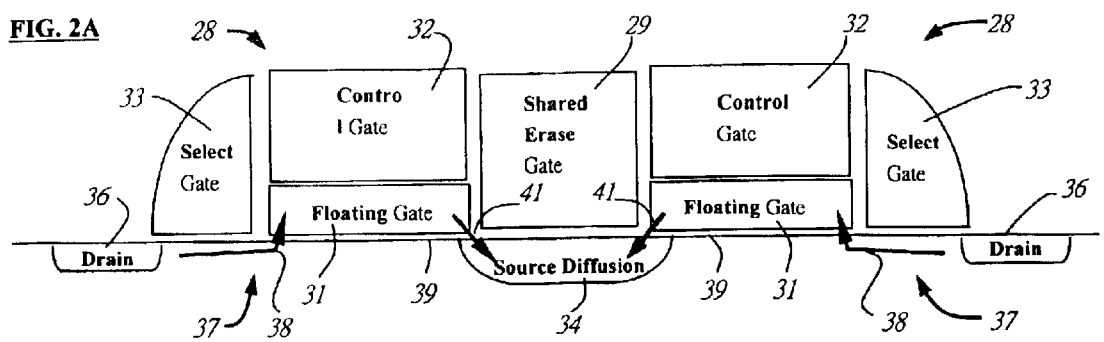
FIGS. 2A and 2B are cross-sectional views, somewhat schematic, taken along line 2—2 in FIG. 5, of two embodiments of a self-aligned split-gate NOR-type flash memory cell array according to the invention.
Figure 2B:
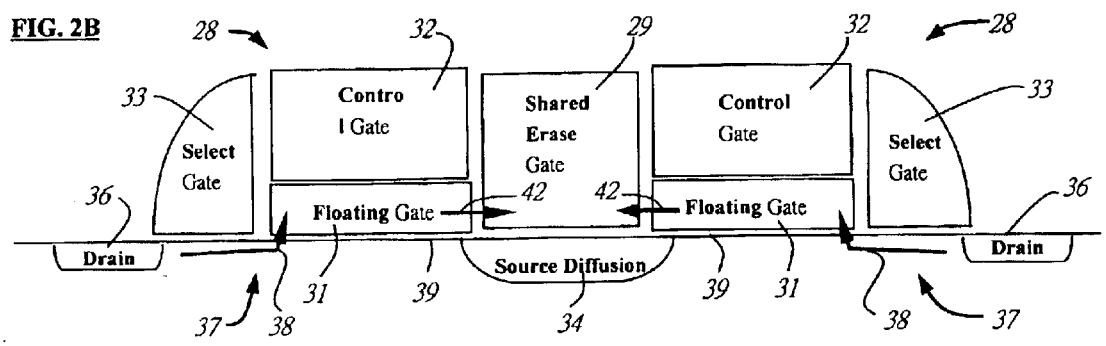

In the embodiments of FIGS. 2A and 2B, two memory cells 28 share a common erase gate 29. Each cell has vertically stacked, self-aligned floating and control gates 31, 32, with the floating gate 31 being relatively thin (e.g., 100 Å–700 Å) and the control gate 32 positioned above the floating gate. Each cell also has a select gate 33 which is positioned to one side of the stacked floating and control gates. The select gates and the erase gate are formed simultaneously from a layer of polysilicon which is deposited across the wafer, then etched anisotropically in a dry etching process.

Source and drain diffusions 34, 36 are formed in the substrate, with the source region extending beneath the erase gate and the edge portions of the floating gates. The drain regions extend beneath the edge portions of the select gates opposite the stacked gates, and are shared with the select gates in adjacent cells (not shown).

In these embodiments, programming takes place in the mid-channel regions 37 between the select gates and the floating gates. During a programming operation, the control gate is biased to about −10 volts, the select gates are biased to about 1–3 volts, the source region is biased to about −6 volts, and the drain region is grounded. These biasing conditions produce a strong, vertically oriented electric field in the channel regions 37 between the select gates and the floating gates, with electrons being delivered to the edge portions of the floating gates by hot electron injection from the channel regions, as indicated by arrows 38. This is sometimes referred to as source-side injection.

In contrast to the prior art where erasing is done on the same side of the floating gate as programming, in the memory cells of the present invention, programming and erasing are done on opposite sides of the floating gate. The shared erase gate and the source diffusion are either independently biased or electrically connected to facilitate electron tunneling during erase operations.

In the embodiment of FIG. 2A, erasing is done by tunneling through the thin gate oxide 39 beneath the floating gates to the source region. In this embodiment, the control gates are biased negatively to a level of about −10 volts, and the source region is biased to about 6 volts, thereby establishing a strong electric field between the edge portions of the floating gates and the source diffusion. That field causes electrons to tunnel from the edge portions of the floating gates through the gate oxide to the source, as indicated by arrows 41.

Erasing in this manner has the advantage that the thermal gate oxide is very stable and durable compared to the inter-poly oxide between the floating gates and the erase gate. In order to avoid the possibility of band-to-band tunneling with a shallow source junction, the erase gate can be either floated or biased to a voltage to which offsets the high electric field in the edge portions of the source diffusion. The separation of the select and erase gates also has the advantage of allowing the thickness of the select gate oxide to be independently adjusted so as to accommodate low-voltage read operations.

In the embodiment of FIG. 2B, erasing is done by the tunneling of electrons from the floating gates to the erase gate. The control gates are either grounded or negatively biased, the substrate is grounded, and the erase gate 56 is biased positively to a voltage of about 6–12 volts. The electric field thus established in the edge portions of the floating gates promotes the tunneling of electrons from the floating gates to the erase gate, as indicated by arrows 42. If desired, the source can be floated or biased to a moderately positive level to help redistribute the concentrated electric field associated with the lower corners of the floating gates.

Figure 3A:
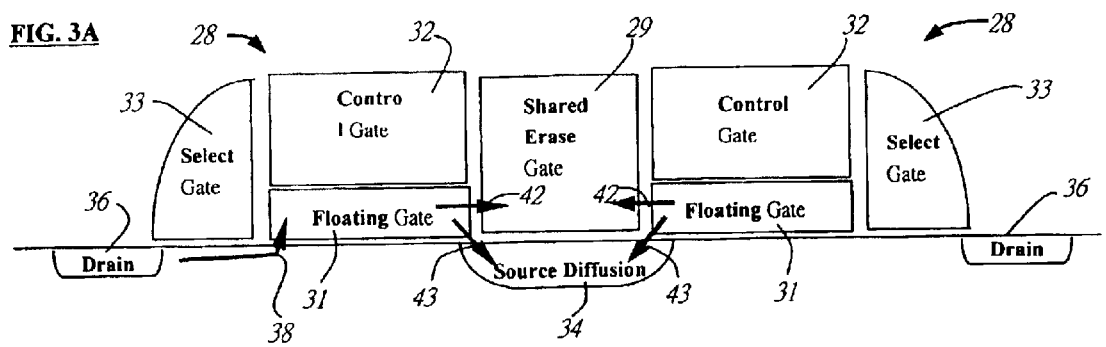
FIGS. 3A and 3B are cross-sectional views, similar to FIGS. 2A and 2B, of another two embodiments of a self-aligned split-gate NOR-type flash memory cell array according to the invention.
Figure 3B:
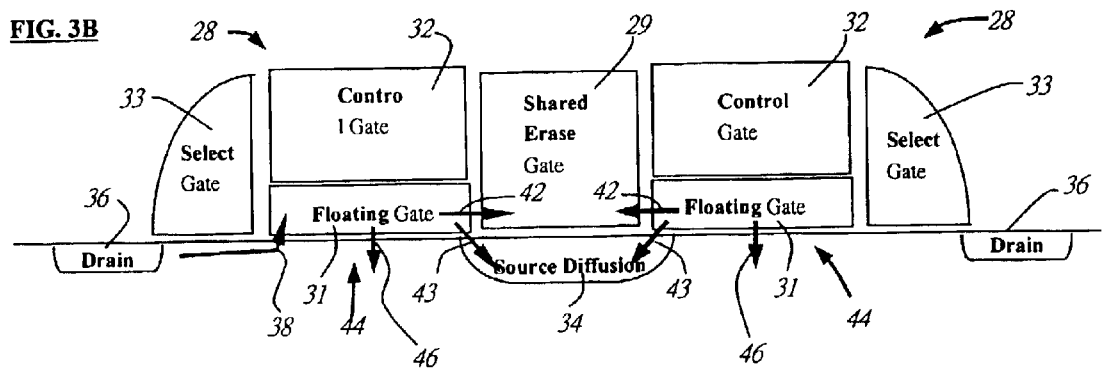

The cell structure shown in FIGS. 3A and 3B is similar to that of FIGS. 2A and 2B, and like reference numerals designate corresponding elements in the different embodiments. In the embodiments of FIGS. 3A and 3B, however, source diffusion 34 and erase gate 29 are tied together electrically, and an erase operation is performed by biasing control gates 32 negatively to a level of about −10 volts, with the source and erase gate node at about 6 volts, and the select gate and drain floating. This creates a strong, but uniformly distributed electric field along the edge of floating gate, surrounded by the erase gate and the underlying source diffusion, and electrons tunnel from the floating gate both to the erase gate and to the source region, as indicated by arrows 42, 43. Erase efficiency is thus greater than it is with only inter-poly tunneling, and band-to-band tunneling is suppressed by the field from the proximate corner of the erase gate.

In the embodiment of FIG. 3B, the erase gate and the source node are further tied to the isolated substrate channel 44 beneath the floating gate.

This provides an additional tunneling path for electrons 46 from the floating gate to the channel, and eliminates band-to-band tunneling in the source diffusion.

As illustrated in FIGS. 4A–4E, depending upon the requirements of cell coupling and electrical isolation between control gates 32 and select gates 33 and erase gate 29, floating gates 31 can project laterally on one or both sides of the control gates toward the select gates and/or the erase gate.

Figure 4A:
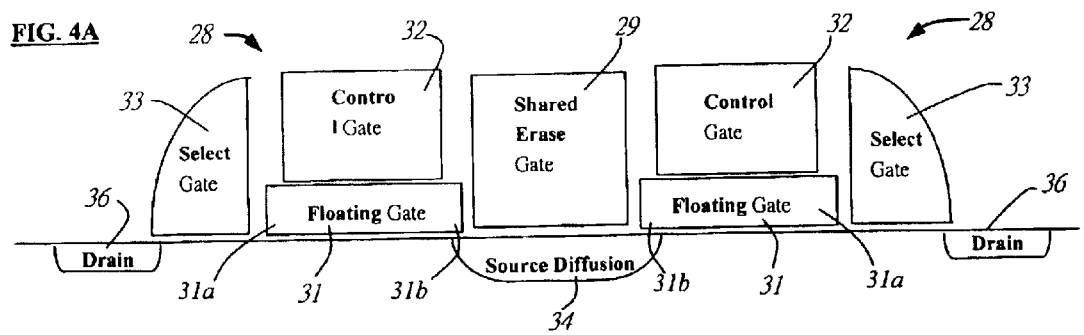
FIGS. 4A–4E are cross-sectional views, similar to FIGS. 2A and 2B, of additional embodiments of a self-aligned split-gate NOR-type flash memory cell array according to the invention.

In the embodiment of FIG. 4A, edge portions 31a, 31b of floating gates 31 extend laterally beyond the side walls on both sides of control gates 32, and coupling with both the select gates and the erase gate is increased.

Figure 4B:
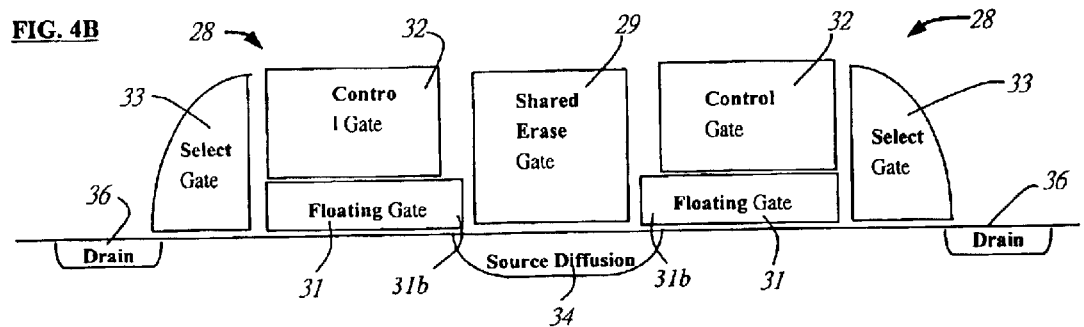

In the embodiment of FIG. 4B, only the edge portions 31b of the floating gates closer to the erase gates extend beyond the control gates. The edge portions 31a closer to the select gates are aligned with the side walls of the control gates.

Figure 4C:
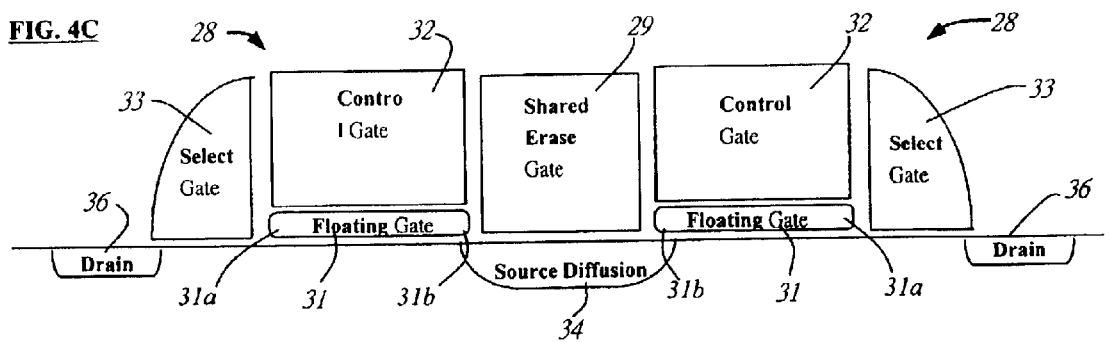

The embodiment shown in FIG. 4C has relatively thin floating gates 31 with rounded side edges 31a, 31b, as in the memory cells shown in U.S. Pat. Nos. 6,091,104 and 6,291,297. This structure is advantageous in that it provides enhanced electron tunneling through the inter-poly oxide to the erase gates, as well as being durable.

Figure 4D:
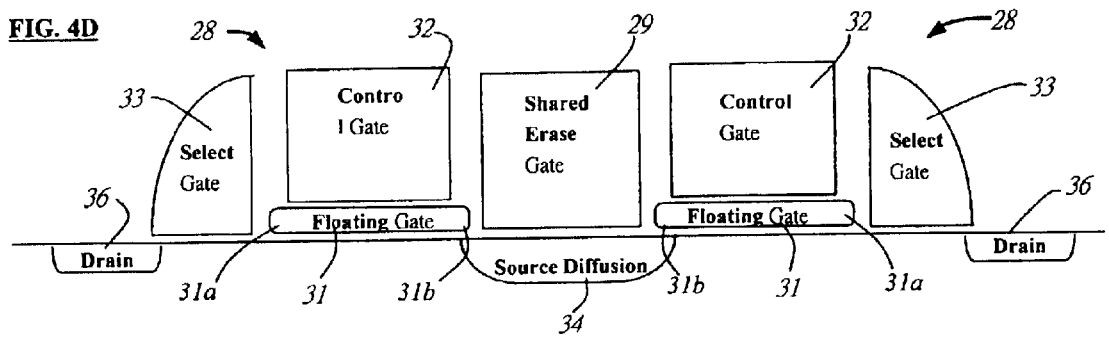
Figure 4E:
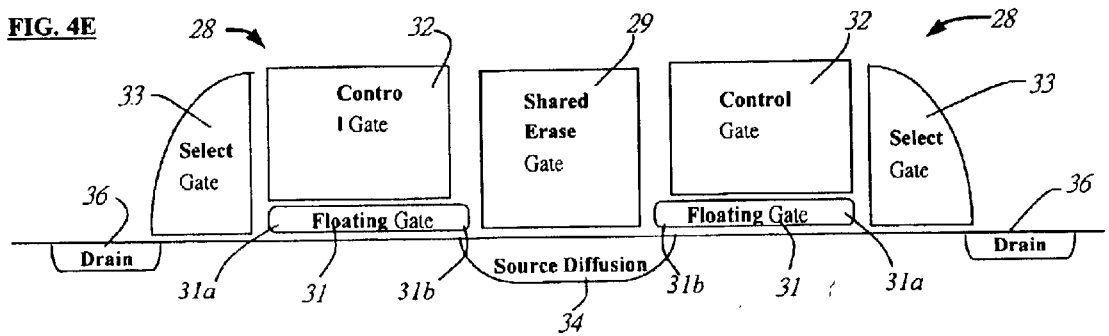

In the embodiment of FIG. 4D, the edge portions 31a, 31b of the relatively thin floating gates 31 extend laterally beyond the side walls on both sides of control gates 32, with increased coupling between the floating gates and both the select gates and the erase gate.

In each of these embodiments, the extension of the floating gates beyond the sides of the control gates is on the order of 500 Å or less.

With the cell structures of the invention, fabrication is simplified because it is not necessary to remove polysilicon from the source regions and the valleys between the control and floating gate stacks. These cell structures also provide significant advantages over the prior art in both programming and erasing performance.

The placement of the self-aligned erase gate above source region 34 which is shared by two floating and control gate stacks on opposite sides of the erase gate eliminates the need for select gate polysilicon removal. This makes fabrication easier and allows the use of minimum feature size in the source opening, which greatly reduces the size of the cells.

Electrically, the cell is programmed and erased on opposite sides of the floating gate. This has the advantage that electron migration into and out of floating gate during programming and erase operations can be independently controlled and optimized, without danger of the tunnel oxide wearing out as a result of electron trapping. In prior art devices, electrons trapped in the inter-poly oxide can build up a repulsive electric field which degrades the mid-channel injection of electrons through the channel gate oxide. In addition, oxide degradation is accelerated by the build up and release of trapped electrons. With separate electron injection and erasure sites, oxide wear and the build-up of repulsive electric fields which interfere with ion injection can be minimized. As a result, the separate select gate and erase gate provide better oxide endurance during cyclical operation of the memory cells.

Another advantage of these memory cells is that when the erase gate and the source diffusion are electrically tied together, erasure is further facilitated by tunneling of electrons from the floating gate to the source diffusion through the gate oxide beneath the floating gate. The source junction electric field beneath the projecting floating gate helps to disperse the intense field surrounding the tip of the rounded floating gate, thus make the inter-poly oxide more tolerable to electron trapping during prolonged erase cycles. Furthermore, the physically separated, but electrically connected erase gate and source diffusion helps to reduce possible reverse tunneling as a result of thermally grown poly-oxide re-entrant, which has been a common problem in split gate Flash memory.

The memory cells of the invention also eliminate the band-to-band tunneling that is commonly encountered when erasing floating gate electrons to the source diffusion. Having the erase gate directly above the source junction provides a less stretched electric field than conventional cells with source-side erasing, and the more concentrated electric field results in increased immunity to source junction band bending near the edge of the floating gate. In addition, with a triple well process, the substrate and channel can be biased to the source diffusion and erase gate potential, so that the band-to-band tunneling associated with the source junction is completely eliminated.

Another important feature of the invention is that by separating the programming node and the erase node, the corresponding devices can be adjusted and optimized individually with the rapidly evolving process technology. For example, the select gate oxide can be a low-voltage thin oxide, which is not feasible when programming and erasing are both done through the same select gate because of the high voltage requirement of select gate during erase operations. Moreover, a spacer can be used on the select gate side to avoid disturbances induced by re-entry into the select gate and removed from the erase gate side for optimized inter-poly oxide processing.

Figure 5:
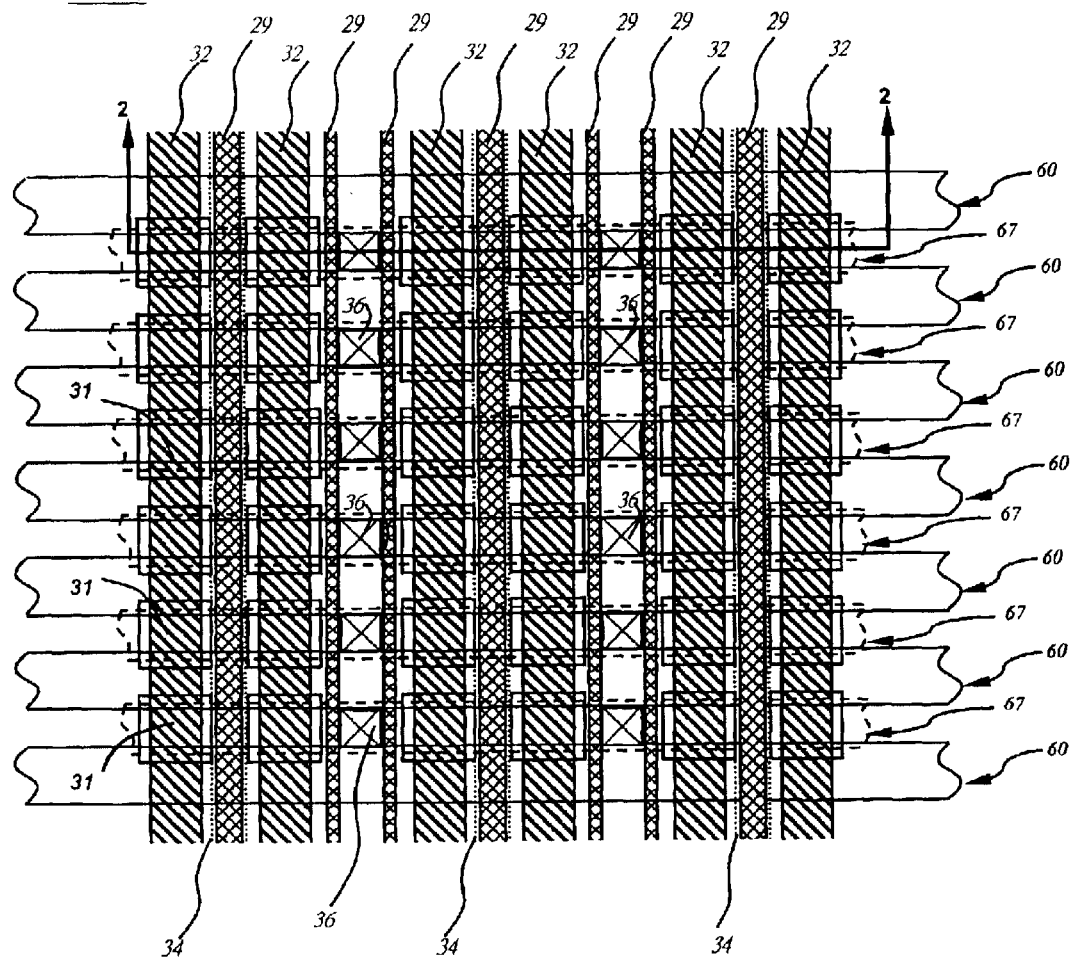
FIG. 5 is a top plan view of the embodiments of FIGS. 2A–2B, 3A–3B and 4A–4E.

In the plan view of FIG. 5, the electrical connections between the source diffusions and the erase gates are not shown for ease of illustration.

The NOR-type memory cell arrays of FIGS. 4A and 4C can be fabricated by the process illustrated in FIGS. 6A–6E. In this process, an oxide layer 48 is thermally grown on a monocrystalline silicon substrate 49 which is prepatterned with strips of field oxide or shallow trench isolation 60 parallel to bit lines 67, as shown in FIG. 5. The substrate can be in the form of a P-well, P-substrate or N-well material.

Thereafter, a conductive layer 51 of polysilicon or amorphous silicon (poly 1) is deposited on the oxide layer to a thickness on the order of 100 Å–1000 Å, with a thinner layer being deposited if the side edges of the floating gates 31 are to be rounded as in FIG. 4C and a thicker layer being deposited if the edges are not going to be rounded.

The poly 1 layer is patterned in a direction parallel to the bit line, following which a dielectric film 52 (the inter-poly dielectric) is formed on it. That film can be either a pure oxide or a combination of oxide and nitride, and in one presently preferred embodiment it is an ONO film consisting of a bottom layer of oxide having a thickness of 30 Å–100 Å thick, a central layer of nitride having a thickness of 60 Å–300 Å thick, and a top layer of oxide having a thickness of 30 Å–100 Å.

The poly 1 material is preferably doped with phosphorus, arsenic or boron to a level on the order of $10^{17}$ to $10^{20}$ cm$^{-3}$. That can be done either by in-situ doping during the deposition of the poly 1 layer or by ion implantation either directly into the poly 1 layer or through the inter-poly dielectric.

A second layer of polysilicon (poly 2) 53 is deposited on the inter-poly dielectric, and subsequently etched to form control gates 32. The poly 2 is deposited to a thickness of 1500 Å–3500 Å, and is heavily doped with phosphorus, arsenic or boron to a level on the order of $10^{20}$ to $10^{21}$ cm$^{-3}$. A 300 Å–3000 Å layer 54 of oxide or nitride 46 is formed on the poly 2 layer by chemical vapor deposition (CVD) and used as a mask to prevent the control gates from etching away during subsequent dry etching steps.

The control gate pattern is defined in a photolithographic step, following which the unmasked portions of oxide or nitride layer 54 and poly 2 layer 53 are etched away anisotropically, leaving thick dielectric caps 54 on the control gates, as illustrated in FIG. 5B. A relatively thin thermal oxide 56 is then grown on the side edges of the control gates to protect them from possible CVD damage in subsequent processing. Thereafter, a dielectric film (not shown) such as oxide or nitride is deposited across the wafer to a depth of about 300 Å–500 Å, then etched anisotropically to remove the dielectric from the flat areas, leaving dielectric spacers 57 on the sides of control gates. Silicon nitride is a particularly preferred material for the spacers since its unique tensile stress properties facilitate enhanced silicon oxidation and, hence, rounding of the side edges of the floating gates during gate oxidation.

Alternatively, spacers 57 can be formed by thermal oxidation of the poly 2 material or by combined oxidation and deposition of oxide or silicon nitride.

Figure 6A:
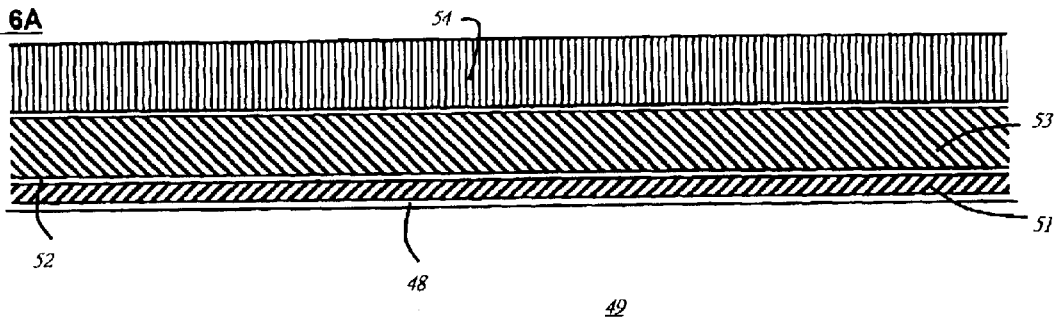
FIGS. 6A–6E are schematic cross-sectional views illustrating the steps in one embodiment of a process for fabricating a NOR-type flash memory cell array in accordance with the invention.
Figure 6B:
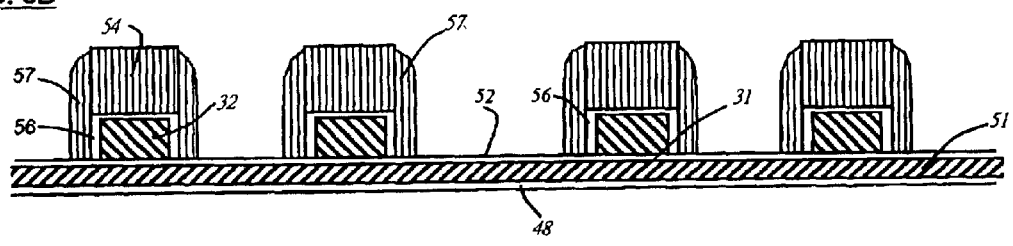
Figure 6C:
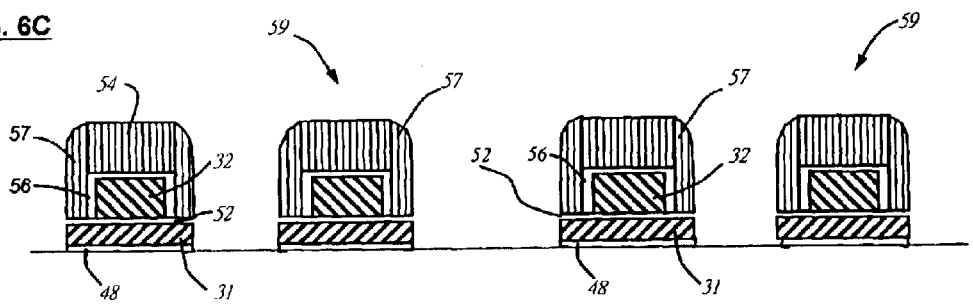

After the dielectric spacers are formed, the inter-poly dielectric 52, poly 1 layer 51 and oxide layer 48 are etched anisotropically to form a plurality of separate gate stacks 59, as shown in FIG. 6C. Each of the gate stacks includes a floating gate 31, a control gate 32, a gate oxide 48 beneath the floating gate, an inter-poly dielectric 52 between the two gates, and a relatively thick cap 54 on the control gate.

Figure 6D:
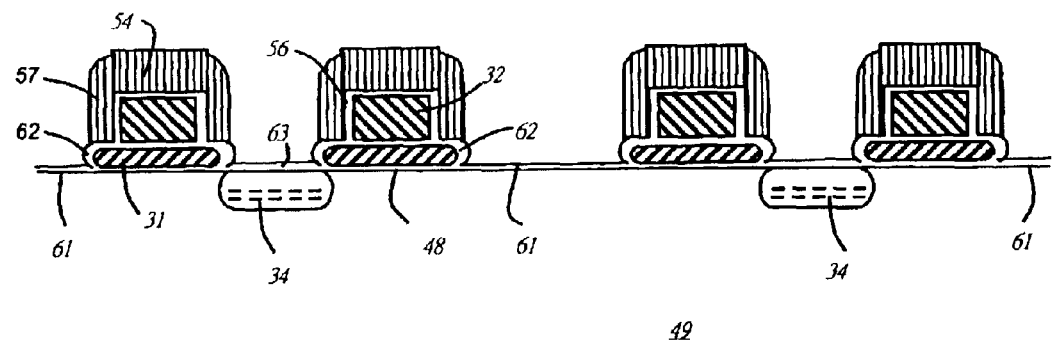

Source diffusion regions 34 are implanted in the substrate between adjacent pairs of the stacked gates, as shown in FIG. 6D, following which another thermal oxidation is performed to form channel gate oxides 61 for the select gates, poly-oxides 62 on the side edges of the floating gates, and thermal oxides 63 on the source implanted areas. The select gate oxide has a thickness of about 40 Å–200 Å, and it is used as a tunnel oxide. If oxides of different thicknesses are required, one or more additional oxidation steps can be performed. A thin CVD oxide having a thickness of about 50 Å–200 Å can be deposited either before or after the thermal oxidation to improve the quality of oxide films and reduce disturbances between the select gates and the floating gates.

During thermal oxidation, the side walls 31$a$, 31$b$ of the floating gates become rounded because the oxidation rate of the poly 1 is faster next to the interface between the poly 1 and the bottom oxide of the inter-poly dielectric and the interface between the poly 1 and the floating gate oxide. This rounded curvature results in an electric field enhancement effect, which facilitates electron tunneling from the floating gates to the select gates. Moreover, the rounding of the side edges eliminates the localized trapping effect that occurs in the tunnel oxide near the square corners of a floating gate when a cell operates in erase mode and the electrons tunnel from the floating gate to the select gate. In applications where the rounded floating gates are connected electrically to the source diffusions, the localized trapping is further suppressed by electric field smoothing.

As a result of these processing steps, each of the control gates is self-aligned with the floating gate beneath it, and the control gate is narrower than the floating gate, with the edge portions of the floating gate extending laterally beyond the sides of the control gate. The oxidation process can be optimized to ensure that proper stress is exerted on the projecting edge portions of the floating gates during the oxide growth, resulting in rounding of the side edges of the floating gates.

Figure 6E:
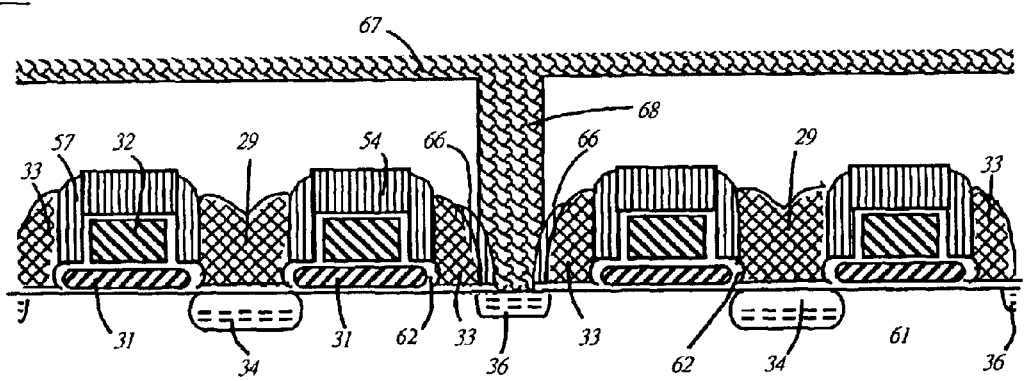

Following thermal oxidation, a conductive layer (poly-3) is deposited over the entire wafer. This layer is typically doped polysilicon or polycide, and it is deposited to a thickness on the order of 1500 Å–4000 Å. The poly-3 layer is etched anisotropically, to form erase gates 29 and select gates 33, as illustrated in FIG. 6E. Being formed in this manner, the erase gates and the select gate are self-aligned with and parallel to the control gates.

A layer of silicon nitride having a thickness on the order of 200 Å–600 Å, is deposited on the outer side walls of select gates 33 and etched to form spacers 66, following which drain diffusion regions 36 are implanted in the substrate between the spacers. Metallization is subsequently applied and etched to form bit lines 67 and self-aligned bit line contacts 68, with the silicon nitride spacers protecting against oxide etching during the process.

A process for fabricating a cell array in which the floating gates extend beyond the control gates only on the side facing the erase gates (the embodiment of FIG. 4E) is illustrated in FIGS. 7A–7E. This process is generally similar to the process of FIGS. 6A–6E except for the order in which some of the steps are performed.

Figure 7A:
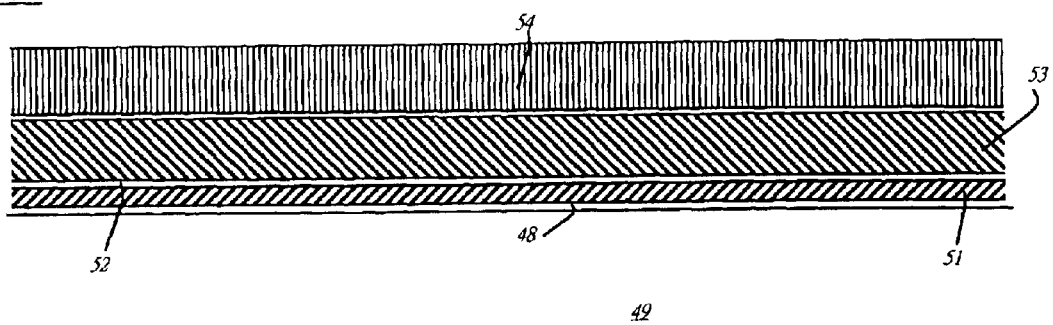
FIGS. 7A–7E are schematic cross-sectional views illustrating the steps in a second embodiment of a process for fabricating a NOR-type flash memory cell array in accordance with the invention.
Figure 7B:
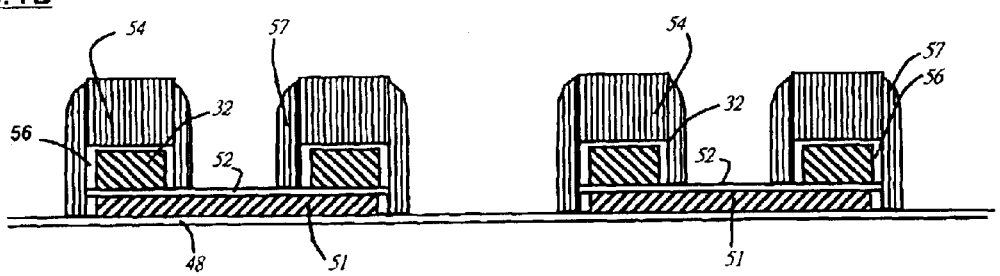

In this embodiment, the starting layers are formed, oxide or nitride layer 54 and poly 2 layer 53 are etched to form control gates 32, and thermal oxide 56 is the grown on the side edges of the control gates, as in the embodiment of FIGS. 6A–6E. At that point, however, poly 1 layer 51 and dielectric film 52 are etched away in the regions 69 where the drain diffusions will be formed. Dielectric spacers 57 are formed on the sides of the control gates, with the spacers on the sides where the select gates will be formed extending to gate oxide layer 48 and the spacers on the sides where the erase gates will be formed terminating at dielectric layer 52, as illustrated in FIG. 7B.

Figure 7C:
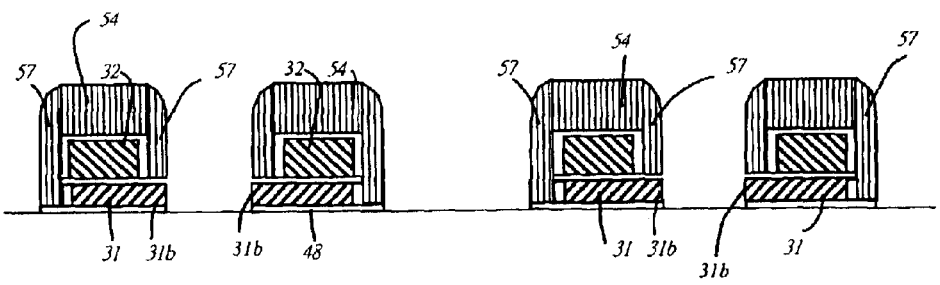
Figure 7D:
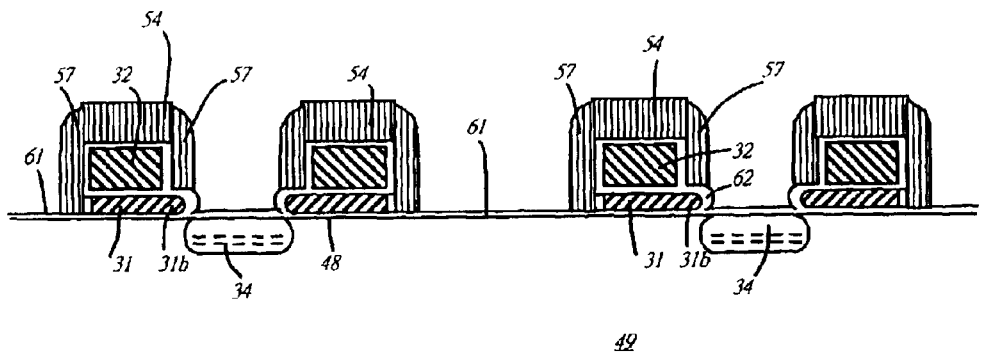
Figure 7E:
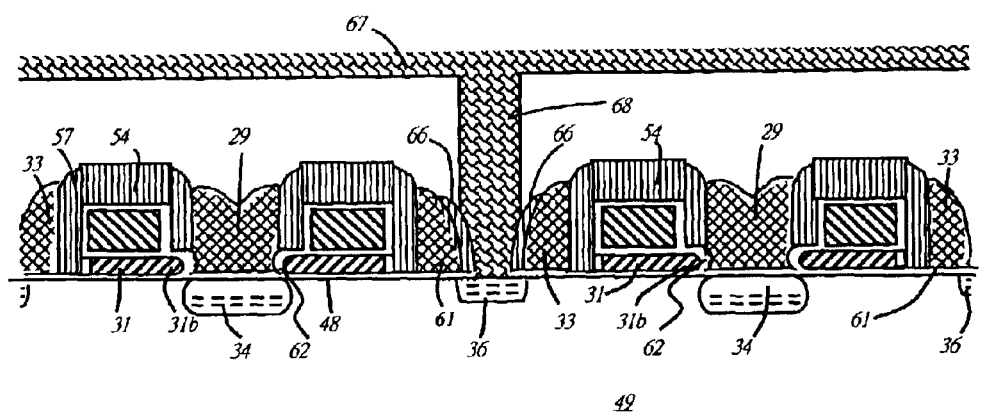

Using dielectric caps 54 and dielectric spacers 57 as a mask, the exposed portions of layers 48, 51 and 52 are etched away, leaving separate gate stacks, with the edge portions 31b of the floating gates extending beneath dielectric spacers 57 on the erase gate or source sides of the stacks, as illustrated in FIG. 7C.

The remainder of the process is as described above in connection with FIGS. 6A–6E, the main difference being that only the edges 31b of the floating gates facing the erase gates are rounded because they are the only ones that are exposed during the oxidation step.

Figure 8A:
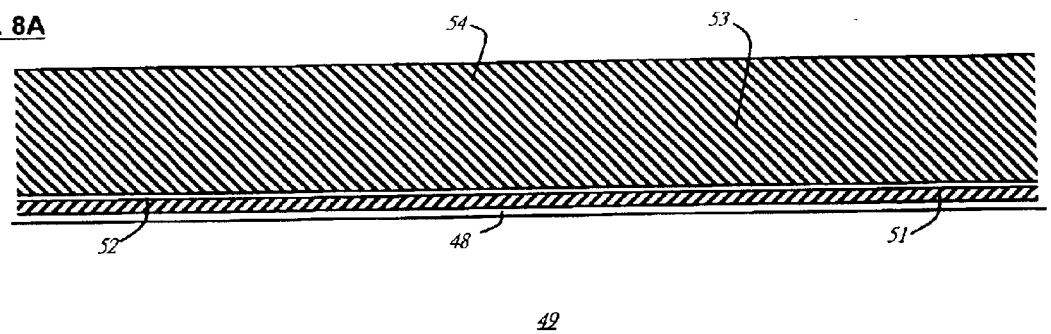
FIGS. 8A–8D are schematic cross-sectional views illustrating the steps in a third embodiment of a process for fabricating a NOR-type flash memory cell array in accordance with the invention.
Figure 8B:
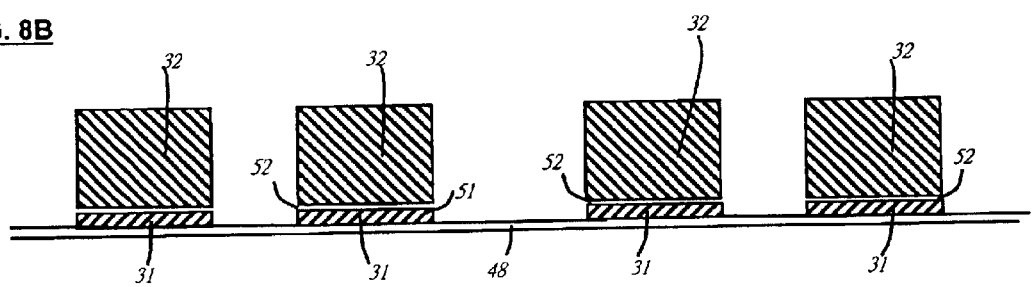

Another process for fabricating a NOR cell array in which the floating gates extend on both sides of the control gates is illustrated in FIGS. 8A–8D. The starting layers are deposited as in the other processes, and the poly 1, poly 2 and inter-poly layers are etched away in the regions where the select and erase gates are to be formed, leaving the stacked control gates 32 and floating gates 31, as illustrated in FIG. 8B.

Figure 8C:
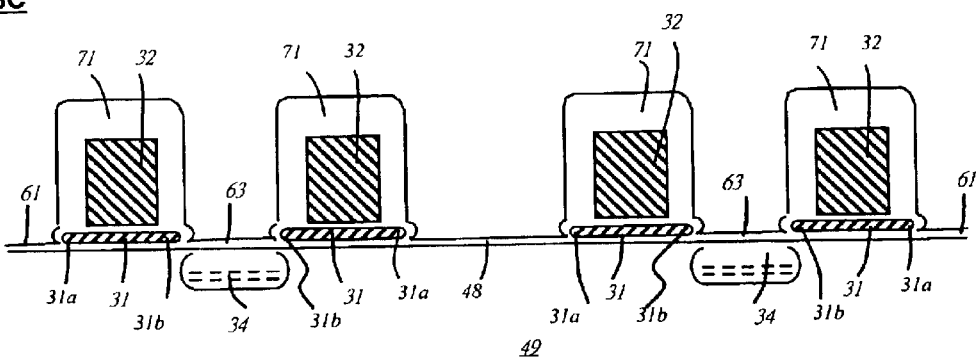

Oxide spacers 71 are then formed simultaneously on the exposed side walls or edges of the floating gates and control gates by thermal oxidation of the poly 1 and poly 2, as illustrated in FIG. 8C. The relative thinness of the poly 1 layer limits the oxide growth on the edges of the floating gates, which results in the oxide spacers being thicker on the control gates than on the floating gates. This self-limiting formation of the spacers provides both sufficient insulation between the control and subsequently formed erase gates and sufficient thinness of the oxide for complementary erase tunneling at the erase node. During the course of the oxidation process, the side edges 31a, 31b of the floating gates become rounded as discussed above.

Figure 8D:
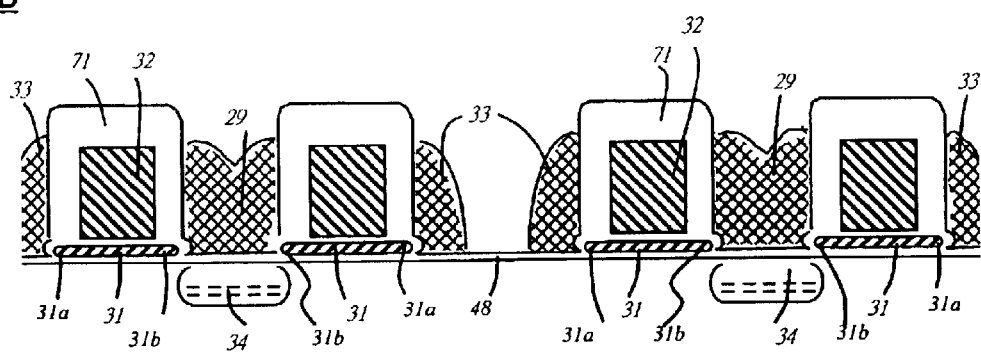

Source diffusion regions 34 are then implanted in the substrate, gate oxides 61, 63 are grown, formed as in the other embodiments. Select gates 33 and erase gates 29 are then formed, as illustrated in FIG. 8D, following which the drain region diffusion, bit lines and bit line contacts are also formed as in the other embodiments.

An exemplary set of biasing conditions for an embodiment of the cell array in which the erase gates and the source diffusions are connected together as an erase node is listed in Table 1. Embodiments in which the erase gates and source diffusions are not electrically connected provide even greater flexibility in the biasing of the erase gates and source diffusions and, hence, in the overall enhancement of erase tunneling and the prevention of band-to-band tunneling.

TABLE 1

| Operating Mode | Control Gate Select | Control Gate Unselect | Select Gate Select | Select Gate Unselect | Bit Line Drain Select | Bit Line Drain Unselect | Erase Gate, Source Select | Erase Gate, Source Unselect |
|---|---|---|---|---|---|---|---|---|
| Erase | −7 to −12 | 0 | Floating | Floating | Floating | Floating | 3–7 | Floating or 3–7 |
| Program | 7–12 | 0 | 1.5–3 | 0 | 0 | 1–3 | 4–8 | 0 |
| Read | 1–3 | 1–3 | 3–5 | 0 | 1.5–3 | 0 | 0 | 0 |

*All values are in Volts.

During an erase operation, electrons are forced to tunnel from the floating gate to the source diffusion and the erase gate, leaving positive ions in the majority in the floating gate. When the electric field across the tunnel oxide is more than 10 mV/cm, Fowler-Nordheim tunneling becomes significant, and electrons with sufficient energy can tunnel from the cathode electrode (floating gate) to the anode electrode (source diffusion and erase gate).

In the erase mode illustrated in Table 1, the control gate of a selected memory cell is biased to a level of −7 to −12 volts, the select gate is biased to 3–7 volts, and the bit line and source node are kept floating. In this example, the coupling ratio between the control gate and the floating gate is typically about 65%–80%, which means about 65%–80% of the control gate voltage is coupled to the floating gate. Biasing the erase node (the erase gate and the source diffusion) together with the channel substrate totally eliminates band-to-band tunneling in source junction, at the cost of a slightly reduced coupling ratio.

With these bias conditions, most of the voltage between the control gate and the erase node appears across the tunnel oxide surrounding the rounded side edges of the floating gate, which triggers Fowler-Nordheim tunneling, with electrons tunneling from the floating gate to the erase gate and the source diffusion. As the floating gate becomes more positively charged, the threshold voltage of the memory cell decreases to a level of about −5 to −1 volts. This results in the formation of an inversion layer in the channel beneath the floating gate when the control gate is biased at 1–3 volts. Hence, the memory cell is in conductive state (logic "1") after an erase operation.

In an unselected memory cell, the control gate is biased to 0 volts, and the erase gate is either floating or biased to 3–7 volts. With these conditions, the electric field between the control gate and the erase gate and source diffusion is not strong enough to produce Fowler-Nordheim tunneling.

During a programming operation, electrons are injected into the floating gate from the mid-channel region by hot carrier injection, and the floating gate becomes negatively charged. In the example shown in Table 1, the control gate in a selected memory cell is biased to a level of 7–12 volts, the select gate is biased to 1.5–3 volts, the bit line is biased to 0 volts, and 4–8 volts is applied to the erase node which includes the source diffusion and the erase gate.

With these bias conditions, most of the source-to-drain voltage appears across the mid-channel region between the select gate and the floating gate, which results in a strong electric field in the mid-channel region. The floating gate is also coupled to a high voltage through the source node and the control gate, and that results in a strong vertical electric field also being established across the oxide between the mid-channel region and the floating gate. When electrons flow from the select gate bit line to the source during the programming operation, they are accelerated by the electric field across the mid-channel region, and some of them become heated.

The hot electrons are accelerated by the vertical electric field between the floating gate and the mid-channel region, with the result that the majority of the hot electrons surpass the oxide barrier height of about 3.1 eV and are injected into the floating gate.

Upon completion of the program operation, the floating gate is negatively charged, and the threshold voltage of the memory cell increases to a level on the order of 3–6 volts. Consequently, the memory cell is turned off, or in a non-conductive state (logic "0"), when the control gate is biased at 1–3 volts during the read operation.

In the unselected memory cells, the bit line and source nodes are biased at 0 volts, the control gate is biased to at −5 to −7 volts, and the select gate is at 1.5–3 volts. The relatively large negative voltage on the control gate turns off the channel beneath the floating gate, which prevents current flow between the bit line and the source of the unselect memory cells.

In the read mode, a selected memory cell is biased with 1–3 volts on the control gate, 1.5–3 volts on the source, 0 volts on the bit line, and 3–5 volts on the select gate. When the memory cell is in the erased state, the read shows a conduction state (logic "1") because both the floating gate and the select gate channels are turned on. When the memory cell is in the programmed state, the read shows a non-conduction state (logic "0") because the floating gate channel is turned off.

In the unselected memory cells, the bit line and source nodes are biased at 0 volts, the control gate is at −5 to −7 volts, and the select gate is at 3–5 volts. The relatively large negative bias on the control gate turns off the channel under the floating gate, which prevents current flow between the bit line and the source of the unselected cells.

Figure 9:
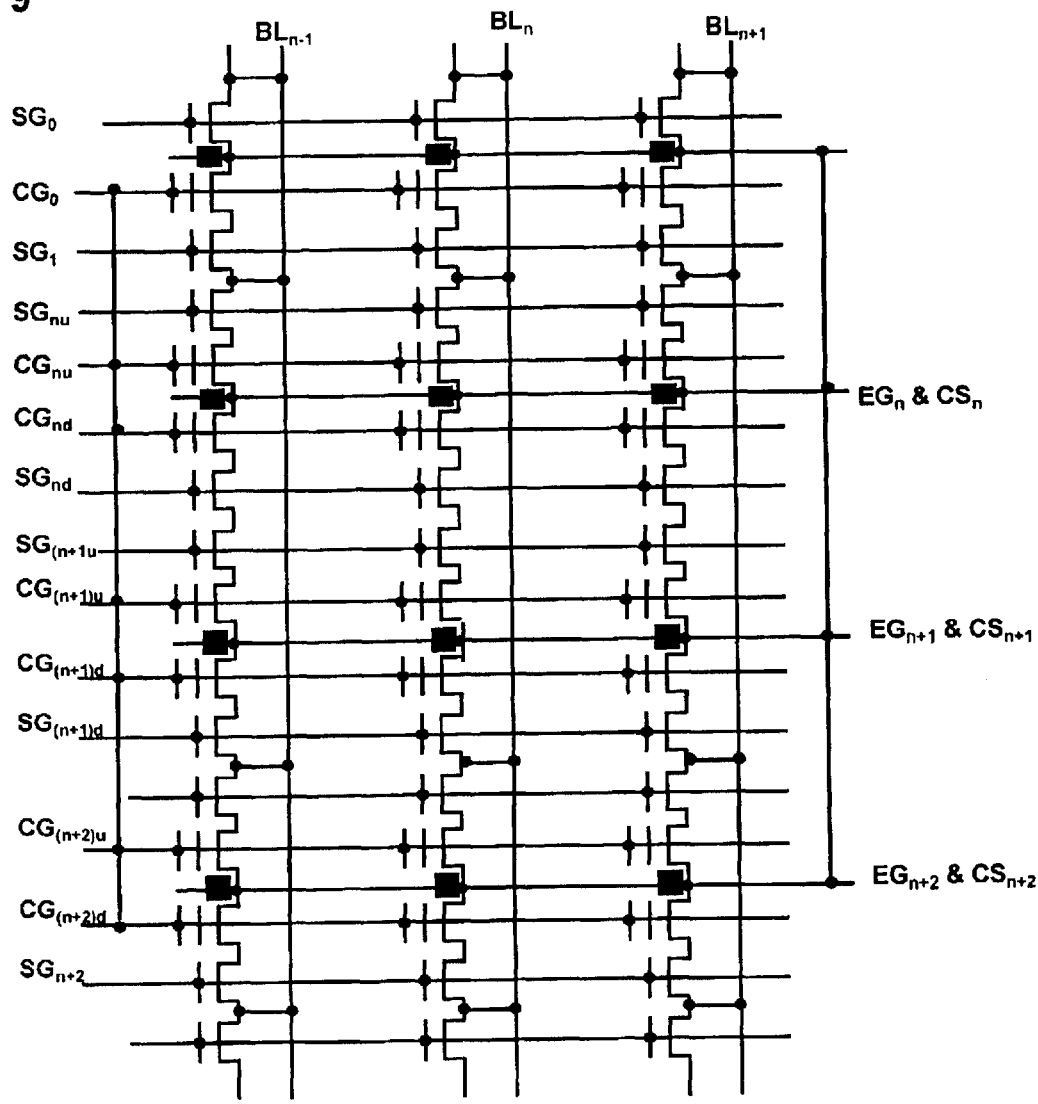
FIG. 9 is a circuit diagram of a small memory array of the type shown in the embodiments of FIG. 2A–2B, 3A–3B, and 4A–4E.

FIG. 9 is a circuit diagram of the cell structures in the embodiments of FIGS. 2A–2B, 3A–3B and 4A–4E. As this figure illustrates, the cell structure of the invention, with the erase gate and the source diffusion tied together electrically for erase operations, provides a memory cell array which is readily decoded.

The invention has a number of important features and advantages. With the select gates and the erase gates on opposite sides of the floating gate and control gate stacks, and the programming and erase paths on opposite sides floating gate, the cell has better performance and durability than prior art devices in which both the programming path and the erase path are close to each other and at the same edge of the floating gate. Moreover, the separate erase path to select gate permits the use of a relatively thin gate oxide for the select gate transistors to accommodate low voltage applications.

The select and erase gates are formed simultaneously and self-aligned with the floating gate and control gate stacks. By utilizing the polysilicon above the source region as the erase gate, rather than removing it, the cells can be made significantly smaller than in the prior art.

The gate oxide beneath floating gate is very stable and durable because the oxide is grown from the silicon substrate, and with the floating gate extending beyond the control gate, electrons also tend to tunnel through the inter-poly oxide to the erase gate. The inter-poly tunneling is generally more efficient than gate oxide tunneling, and band-to-band tunneling of source diffusion, which tends to limit large sector erase operations, is reduced.

Connecting the erase gates and source diffusions together electrically further reduces the band-to-band tunneling to the point that it is substantially eliminated, and it also provides increased immunity to charge trapping in the inter-poly oxide. The cell channel can be biased at the same potential as the source diffusion and the erase gate shared by the control and floating gates to further eliminate band-to-band tunneling in the source diffusion during erase operations.

With the rounded edges of the floating gates and separate programming and erase paths and nodes, degradation of the inter-poly oxide is greatly reduced, and the tunneling electric field is enhanced by the rounded corners. This field enhancement also makes it possible to use a thicker tunnel oxide while maintaining sufficient electron tunneling.

In addition to improving oxide reliability, separating the programming and erase paths to opposite edge portions of the floating gate also facilitates independent adjustment of the select gate oxide thickness for low-voltage applications. In addition, having the erase gate on the source diffusion helps to reduce band-to-band tunneling when shallow source diffusion is required in more aggressive cell scaling.

It is apparent from the foregoing that a new and improved flash memory cell and fabrication process have been provided. While only certain presently preferred embodiments have been described in detail, as will be apparent to those familiar with the art, certain changes and modifications can be made without departing from the scope of the invention as defined by the following claims.

What is claimed is:

1. A flash memory cell array, comprising: a substrate, a source diffusion in the substrate, vertically stacked pairs of floating gates and control gates on opposite sides of the source diffusion, an erase gate directly above the source diffusion and between the stacked gates, select gates on the sides of the stacked gates opposite the erase gate, programming paths from mid-channel regions in the substrate between the select gates and the stacked gates to the edge portions of the floating gates which face the select gates, and erase paths extending from the edge portions of the floating gates which face the erase gates to the source diffusion and to the erase gate.

2. The flash memory cell array of claim 1 wherein the erase gate and the source diffusion are connected together electrically.

3. The flash memory cell array of claim 1 wherein the floating gates extend laterally beyond the control gates toward the erase gate.

4. The flash memory cell array of claim 3 wherein the floating gates extend up to 500 Å beyond the control gates.

5. The flash memory cell array of claim 1 wherein the floating gates are relatively thin and have rounded side edges.

6. The flash memory cell array of claim 1 wherein the floating gates have a thickness on the order of 100 Å–700 Å.

7. The flash memory cell array of claim 1 including a tunneling dielectric having a thickness on the order of 200 Å–1000 Å between the edge portions of the floating gates and the erase gate.

8. The flash memory cell array of claim 7 wherein the tunneling dielectric is selected from the group consisting of CVD silicon oxide, thermally grown silicon oxide, and combinations thereof.

9. The flash memory cell array of claim 1 including a dielectric cap having a thickness on the order of 1000 Å–3000 Å above each of the control gates.

10. The flash memory cell array of claim 9 wherein the dielectric is selected from the group consisting of CVD silicon oxide, thermally grown silicon oxide, and combinations thereof.

11. The flash memory cell array of claim 1 wherein the source diffusion and the erase gate are self-aligned with the stacked pairs of floating gates and control gates between which they are positioned.

12. The flash memory cell array of claim 1 including a bit line diffusion in the substrate between two adjacent select gates.

13. The flash memory cell array of claim 1 including a select gate oxide having a thickness of 10 Å–200 Å which is used for programming and reading.

14. The flash memory cell array of claim 1 including an erase gate oxide having a thickness on the order of 10 Å–500 Å.

15. The flash memory cell array of claim 1 wherein the source diffusion, the erase gate, and the mid-channel region can be independently biased or electrically connected together for selectively controlling electron migration from the floating gate to the source diffusion, the erase gate, and the channel region.

16. The flash memory cell array of claim 1 including dielectric spacers on the side walls of the control gates.

17. The flash memory cell array of claim 16 wherein the dielectric spacers are fabricated of a dielectric material selected from the group consisting of CVD silicon oxide, CVD silicon nitride, thermally grown silicon oxide, and the combination thereof.

18. A flash memory cell array, comprising: a substrate, an tunnel oxide formed on the substrate, a relatively thin floating gate positioned above the tunnel oxide, a control gate which is substantially thicker than the floating gate positioned above and in vertical alignment with the floating gate, a relatively thick dielectric cap on top of the control gate, dielectric spacers on opposite sides of the control gate, a dielectric between the control gate and the floating gate, a select gate and an erase gate on opposite sides of the floating gate and the control gate extending at least part way up the dielectric spacers on the control gate but not extending above the dielectric cap on top of the control gate, gate oxides beneath the select gate and the erase gate, a doped drain diffusion in the substrate adjacent to the select gate, a doped source diffusion in the substrate beneath the erase gate, an inter-poly tunnel oxide between a side edge of the floating gate and the erase gate, an electron tunneling path for electron migration out of floating gate during erase operations through at least one of the tunnel oxides to at least one of the source diffusion and the erase gate, and a hot carrier injection path for injecting electrons into the floating gate during programming operations extending from a channel region between the select gate and the floating gate through the tunnel oxide on the substrate to the floating gate, the electron tunneling path and the hot electron injection path being separately located on opposite sides of the floating gate.

19. The flash memory cell array of claim 18 wherein the floating gate has a thickness on the order of 100 Å–700 Å.

20. The flash memory cell array of claim 18 wherein the floating gate and control gate have vertically aligned side walls.

21. The flash memory cell array of claim 18 wherein the floating gate has a rounded side wall and extends laterally up to about 500 Å beyond control gate toward the erase gate.

22. The flash memory cell array of claim 1 wherein the inter-poly tunnel oxide between the floating gate and the erase gate has a thickness on the order of 200 Å–1000 Å and is selected from the group consisting of CVD silicon oxide, thermally grown silicon oxide, and combinations thereof.

23. The flash memory cell array of claim 18 wherein the spacer between the control gate and the erase gate has a thickness on the order of 200 Å–1000 Å and is selected from the group consisting of CVD silicon oxide, CVD silicon nitride, thermally grown silicon oxide, and combinations thereof.

24. The flash memory cell array of claim 18 wherein the dielectric cap on top of the control gate has a thickness on the order of 1000 Å–3000 Å and is fabricated of a dielectric selected from the group consisting of CVD silicon oxide, CVD silicon nitride, thermally grown silicon oxide, and combinations thereof.

25. The flash memory cell array of claim 18 wherein the source diffusion and the erase gate are self-aligned with the floating gate and the control gate.

26. The flash memory cell array of claim 18 including a bit line diffusion in the substrate and self-aligned with the floating gate and the control gate.

27. The flash memory cell array of claim 18 wherein oxide beneath the select gate oxide has a thickness of on the order of 10 Å–200 Å and is used for programming and reading operations.

28. The flash memory cell array of claim 18 wherein the source diffusion and the erase gate can be can be independently biased or electrically connected together for selectively controlling electron migration from the floating gate to the source diffusion and the erase gate.

29. The flash memory cell array of claim 18 wherein the erase gate oxide has a thickness on the order of 10 Å–500 Å and is used for erase operations.

30. The flash memory cell array of claim 18 wherein the source diffusion, the erase gate, and the mid-channel region can be independently biased or electrically connected together for selectively controlling electron migration from the floating gate to the source diffusion, the erase gate, and the channel region.

31. The flash memory cell array of claim 18 wherein the dielectric spacers on the control gate are fabricated of a material selected from the group consisting of CVD silicon nitride, thermally grown silicon oxide, and combinations thereof.

* * * * *